United States Patent [19]

Nakamura et al.

[11] 4,115,832
[45] Sep. 19, 1978

[54] IGNITER UTILIZING A NEGATIVE RESISTANCE LIGHT EMITTING DIODE

[75] Inventors: Tutomu Nakamura, Akashi; Junichiro Shigemasa, Yamatokoriyama; Zenpei Tani, Tondabayashi, all of Japan

[73] Assignee: Sharp Kabushiki Kaisha, Osaka, Japan

[21] Appl. No.: 750,627

[22] Filed: Dec. 15, 1976

[30] Foreign Application Priority Data

Dec. 16, 1975 [JP] Japan ............................ 50-150341
May 19, 1976 [JP] Japan ............................ 51-58181

[51] Int. Cl.$^2$ .................................................. F23Q 3/01
[52] U.S. Cl. .................................................. 361/256
[58] Field of Search .............. 361/256, 257; 331/115, 331/143, 150; 307/287; 357/17

[56] References Cited

U.S. PATENT DOCUMENTS

| | | | |
|---|---|---|---|
| 3,349,284 | 10/1967 | Roberts | 361/256 |
| 3,609,747 | 9/1971 | Ngo | 307/287 |
| 3,757,174 | 9/1973 | Shigemasa et al. | 357/17 |
| 3,824,432 | 7/1974 | Gersing | 361/256 |
| 4,005,343 | 1/1977 | Lamprecht | 361/256 |

FOREIGN PATENT DOCUMENTS

1,077,959  8/1967  United Kingdom ............ 361/256

*Primary Examiner*—J. V. Truhe
*Assistant Examiner*—Clifford C. Shaw
*Attorney, Agent, or Firm*—Birch, Stewart, Kolasch & Birch

[57] ABSTRACT

An oscillator utilizing a negative resistance light emitting semiconductor diode is connected in series with voltage booster means which in turn provides a high voltage to electrodes of a gas igniter. Discharge of the gas between the electrodes occurs with the aid of the high voltage derived from the voltage booster means to thereby effect an ignition of the gas. Light emission from the diode in the absence of gas ignition is indicative of a deficiency in the supply of gas, while the absence of light emission in the absence of gas ignition is indicative of a deficiency in the operation of the oscillator circuit.

5 Claims, 11 Drawing Figures

IGNITER UTILIZING A NEGATIVE RESISTANCE LIGHT EMITTING DIODE

BACKGROUND OF THE INVENTION

The present invention relates to an ignition circuit arrangement for use with cigarette lighters, etc., for generating a high voltage effective to achieve an ignition operation.

In accordance with the ignition means embodying the present invention, there are provided an oscillator circuit made up by a negative resistance light emitting semiconductor diode for example, and voltage booster means adapted to convert a sudden change in current flowing through the semiconductor diode into a high voltage. Ignition operation is effected through the utilization of a discharge occuring when the high voltage is generated. The ignition operation, namely, the discharge is effected each time the high voltage is periodically generated. The repeated generation of the high voltage is determined mainly by the circuit constant of the oscillator circuit.

For example, in the case of gas cigarette lighters, the ignition means as set forth above operate effectively even when a blast of wind makes it difficult to ignite because the discharge is periodically repeated. If the negative resistance light emitting diode is provided as set forth above, whether or not the oscillator circuit is in its oscillation state can be confirmed by the light emitting diode. Other components are not required to confirm the oscillation state. In addition, the use of the negative resistance light emitting diode ensures simplified construction and low cost of the oscillator circuit.

BRIEF DESCRIPTION OF THE DRAWINGS

A better understanding of the invention may be had from a consideration of the following detailed description taken in conjunction with the accompanying drawings in which.

DETAILED DESCRIPTION OF THE INVENTION

Figure 1:
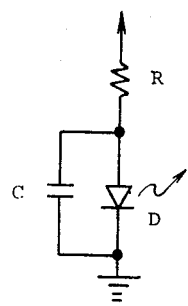
FIG. 1 is a circuit diagram showing a basic oscillator circuit utilizing a negative resistance light emitting diode.
Figure 3:
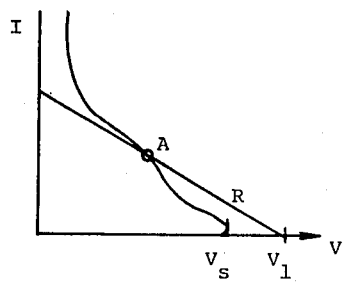
FIG. 3 is a graph showing the light emitting diode and its load used with the igniter of FIG. 2.

Attention is initially called to FIG. 1 of the drawings which illustrates a basic oscillator circuit including a negative resistance light emitting semiconductor diode D, a capacitor C connected in parallel with the light emitting semiconductor diode D and a bias voltage source connected via a load resistor R with the parallel circuit of the diode D and the capacitor C. If the load resistor R and the bias voltage source are properly selected such that the load line of the light emitting diode D intersects within a negative resistance region of the I-V characteristic, for example, a point A as shown in FIG. 3, the capacitor C will be charged via the load resistor R to the bias voltage source. When the charge voltage across the capacitor C is increased beyond a given threshold voltage Vs of the light emitting diode D, diode D is placed into its conductive state to thereby permit the charge accumulated on the capacitor C to be discharged through the light emitting diode D. Under the circumstances a flow of large current passes through the light emitting diode D so that the diode D emits light. After the completion of the discharging the diode D is returned back to its closed state. Again, the capacitor C is charged.

Repetition of the above noted operation makes it possible to provide oscillation at a predetermined cycle and also to provide pulsed light emission at the light emitting diode D.

Accordingly, the present invention is characterized by application of the above discussed oscillator to an igniter wherein a high voltage is generated in response to a sudden change in current flowing through the light emitting diode in the oscillator to cause sparks effective to ignite gas for example by a high voltage discharge.

Figure 2:
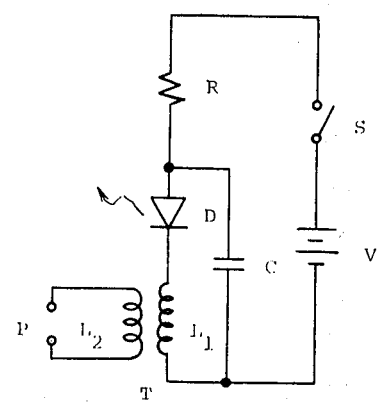
FIG. 2 is a circuit diagram showing one preferred form of an igniter embodying the present invention.

FIG. 2 illustrates a circuit diagram of a preferred embodiment of the present invention, which includes a DC bias voltage source V for example a battery or batteries, a switch S for opening and closing the present circuit, a booster transformer T of which the primary winding $L_1$ is connected in series with the above described negative resistance light emitting diode D, and an ignition plug P connected with the secondary winding $L_2$ of the booster transformer T.

Figure 4:
FIG. 4 is a waveform diagram showing current flowing through the light emitting diode.

When the switch S of FIG. 2 is closed, the capacitor C is charged via the load resistor R to the DC voltage source V. In this instance, the voltage relationship between a threshold voltage Vs of the light emitting diode D and a source voltage $V_1$ will be such as to show $Vs < V_1$. If the threshold voltage Vs is exceeded by the charged voltage on the capacitor C, the light emitting diode D will be in its conductive state. At this time large current flows through the light emitting diode D. After completing the discharging of the capacitor C, the light emitting diode D will be returned back to its non-conductive state. This permits the capacitor C to be charged. The above described operation is repeated, the period or cycle of the current flowing through the light emitting diode D, namely, the oscillation frequency being determined by the DC voltage source V, the load resistor R and the capacitor C. A waveform of the current flowing through the light emitting diode D is illustrated in FIG. 4. It will be obvious from FIG. 3 that since the current illustrated in FIG. 4 also flows through the primary winding $L_1$ of the voltage booster transformer T the high voltage is developed at the secondary winding of the transformer in synchronization with the cycle of the current.

Upon the generation of the high voltage, discharge occurs between the terminals of the ignition plug P creating sparks which ignites a gaseous material in the region of plug P. As noted earlier, the discharge is periodically repeated to thereby ensure that the ignition operation occurs.

Meantime, since the light emitting diode D emits light with the light intensity which resembles the current waveform shown in FIG. 4, whether or not the igniter scheme is in the operative state can be visually displayed and confirmed.

In the case where the igniter fails to ignite the gas, the presence of the light emission derived from the light emitting diode D indicates a shortage of gas while the absence of the light emission determines whether the DC voltage source V is below the desired voltage or broken off.

It is understood that although in the given example the negative resistance light emitting diode D is employed as a single element two separate elements may be used, namely, a negative resistance element and a light emitting diode. Of course, the present igniter is applicable equally to a variety of gas appliances including oil stoves, etc., in addition to cigarette lighters.

Figure 5:
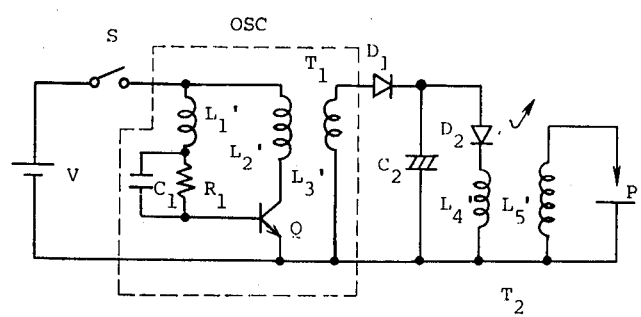
FIG. 5 is an electrical circuit diagram showing another preferred form of the igniter of the present invention.

Another preferred embodiment of the present invention is illustrated in FIG. 5, which includes a switch S, a voltage source V of relatively low voltage and a blocking oscillator circuit OSC operative in response to supply of power via the switch S. The blocking oscillator OSC is of the conventional type which includes a capacitor $C_1$, a resistor $R_1$, a transistor Q and a transformer $T_1$ having three windings $L_1'$, $L_2'$ and $L_3'$. A charging and discharging capacitor $C_2$ is connected between both ends of the output winding $L_3'$ of the transformer $T_1$ via a rectifying diode $D_1$. A negative resistance light emitting diode $D_2$ made of GaAs material for example is connected in series with the primary winding $L_4'$ of a high voltage generating transformer $T_2$ and then across the charging and and discharging capacitor $C_2$. An ignition plug P is connected with the secondary winding $L_5'$ of the high voltage generating transformer $T_2$.

Figure 6:
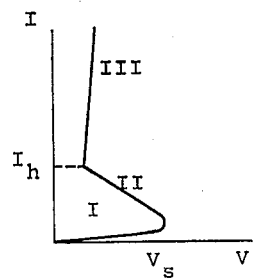
FIG. 6 is a graph showing the characteristic of an essential component used in the igniter of FIG. 5.

FIG. 6 depicts a voltage (V) - current (I) characteristic curve of the negative resistance light emitting diode $D_2$. The diode $D_2$ has three regions, a non-conductive region I wherein the diode is in its high resistance region, a negative resistance region II which shows a reduction in current I with an increase in voltage V and a conductive region III wherein the diode is in its low resistance region. Since the light output increases in proportion to the input current, the diode D in its non-conductive region I emits little or no light while the same in its conductive region III shows intense light emission upon heavy current supply. The threshold voltage of the negative resistance light emitting diode $D_2$ is denoted as Vs and the conductive state sustaining current is denoted as $I_h$. Details of the negative resistance light emitting diode are disclosed and illustrated in U.S. Pat. No. 3,757,174 entitled LIGHT EMITTING FOUR LAYER SEMICONDUCTOR DEVICE and assigned to the present assignee.

When the switch S is closed, base current is supplied from the voltage source V to the transistor Q via the base winding $L_1'$ and the resistor $R_1$ with an accompanying flow of collector current via the collector winding $L_2'$. The base winding $L_1'$ and the collector winding $L_2'$ in combination provide positive feedback for the base current due to their induced voltages so that the collector current is further increased. Once the transistor Q is placed into its saturated state due to such positive feedback effects, no feedback into the base winding $L_1'$ is developed to render the transistor Q non-conductive. During such non-conductive period of the transistor Q the capacitor $C_1$ continues to be discharged. After completing the discharging of the capacitor $C_1$, supply of the base current begins again. The above described operation is therefore repeated.

It is required that the voltage derived from the output winding $L_3'$ of the oscillator transformer $T_1$ be above the threshold voltage Vs of the negative resistance light emitting diode $D_2$ as stated below. Under the assumption that the threshold voltage Vs is about 30V, a relatively low voltage of about 1.3-3V is boosted up to an open-circuit voltage of about 50–60V by proper choice of the turn ratio of the transformer $T_1$. In this manner, the voltage boosting is effected within the blocking oscillator.

It will be noted that the voltage from the output winding $L_3'$ of the oscillating transformer $T_1$ does not assume exactly the open-circuit voltage because the charging and discharging capacitor $C_2$ is connected as the load therefor.

Figure 7:
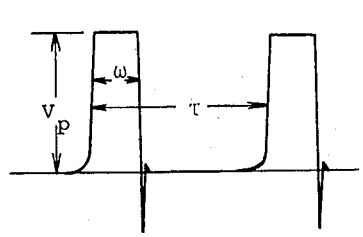
FIG. 7 is a time chart showing a signal waveform for the essential component.

While FIG. 7 is a timing chart showing waveform of a voltage appearing at a junction of the output winding $L_3'$ and the rectifying diode $D_1$, a peak voltage $V_p$, a pulse width $\omega$ and a repetition period $\tau$ are alterable in accordance with the charged state of the charging and discharging capacitor $C_2$. The peak voltage $V_p$ is approximately the charged voltage of the capacitor $C_2$.

This means that the peak voltage $V_p$ increases with an increase in the charged voltage. In addition, the charged voltage of the charging and discharging capacitor $C_2$, that is, the peak voltage $V_p$ has remarkable effects on the interior of the blocking oscillator OSC and therefore an increase in the charged voltage permits the pulse width $\omega$ and the repetition cycle $\tau$ to be reduced.

In any case, the voltage derived from the output winding $L_3$ of the oscillating transformer $T_1$ is rectified via the rectifying diode $D_1$ at the repetion cycle and then charged step-by-step on the charging and discharging capacitor $C_2$.

Figure 8A:
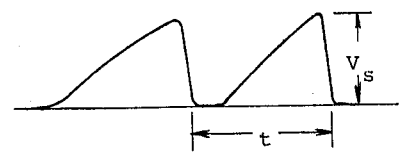
FIGS. 8(A) and 8(B) are time charts showing other waveforms occurring within the igniter of FIG. 5.

A sequence of the above events is repeated a predetermined number of times. If the voltage across the charging and discharging capacitor $C_2$ reaches the threshold voltage Vs of the negative resistance light emitting diode $D_2$ as shown in FIG. 8(A), then the diode $D_2$ is turned on to establish a closed circuit loop consisting of the charging and discharging capacitor $C_2$, the negative resistance light emitting diode $D_2$ and the primary winding $L_4'$ of the voltage boosting transformer $T_2$. The discharge current flows suddenly. As a result, the negative resistance light emitting diode $D_2$ emits light and the voltage boosting transformer $T_2$ induces a voltage of about 10 kV at the secondary winding $L_5'$. Discharge occurs about the ignition plug P to accomplish ignition operation. After ending the discharging of the charging and discharging capacitor $C_2$ the negative resistance light emitting diode $D_2$ is turned off. Again, the charging and discharging capacitor $C_2$ is charged at the repetition cycle $\tau$ with the voltage developed from the output winding $L_3'$ of the oscillating transformer $T_1$. The charging of the capacitor $C_2$ continues during the period where the switch S is closed. The repetition cycle is selected to be ½-⅓ second.

Figure 8B:
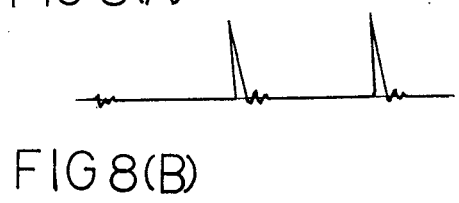

In order to turn off the negative resistance light emitting diode $D_2$, it is required that a backward voltage be applied to the diode $D_2$ or current less than the sustaining current $I_h$ be maintained over the turn off period. For example, even if the frequency of the blocking oscillator OSC is relatively high for example 500 KHz and thus the repetition cycle $\tau$ is shorter than the turn off period and current less than the sustaining current $I_h = 0.1$ mA can not be supplied, the backward voltage is developed at the waveform of the voltage of the primary winding $L_4'$ of the voltage of the primary winding $L_4'$ of the voltage boosting transformer $T_2$ as illustrated in FIG. 8(B) to thereby ensure the turning off of the negative resistance light emitting diode $D_2$. Of course, it will make it possible to turn off the diode $D_2$ if the current less than the sustaining current $I_h$ is maintained over the turn off period through the use of the output from the blocking oscillator OSC. In this manner, upon the generation of the high voltage, discharge is created about the ignition plug P.

Meantime, since the light emitting diode $D_2$ emits light each time current flows therethrough, a visual display of the operating state is provided. In case where the igniter fails to ignite gas, light emission of the light emitting diode $D_2$ represents a shortage of gas. Contrarily, in the absence of the light emission derived from the diode $D_2$, indicates that the source voltage $V_1$ has fallen below a predetermined voltage or the blocking oscillator OSC has a fault therein.

Figure 9:
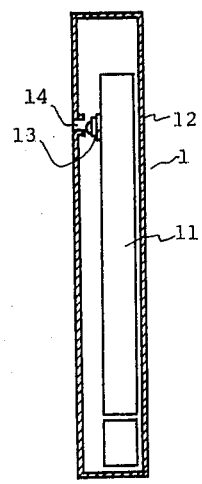
FIGS. 9 and 10 are a cross sectional view and a side view of a cigarette lighter incorporating the igniter of the present invention.
Figure 10:
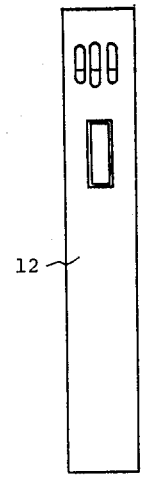

FIGS. 9 and 10 show an example of a cigarette lighter 1 incorporating the above described igniter utilizing the negative resistance light emitting diode. An igniter module 11 is accommodated within a housing 12 with a negative resistance light emitting diode 13 in the module 11 exposed to the surrounding environment via a window 14 to thereby enable confirmation as to whether the module 11 is in its operating state by utilization of light emission derived from the negative resistance light emitting diode 13.

Although there has been described above specific arrangements of the igniter in accordance with the invention for the purpose of illustrating the manner in which the invention may be used to advantage, it will be appreciated that the invention is not limited thereto. Accordingly, any modifications, variations or equivalent arrangements which may occur to those skilled in the art should be considered to be within the scope of the invention.

What is claimed is:

1. An igniter circuit for a gaseous material having means for indicating a deficiency in the quantity of gaseous material or a deficiency in the operation of said circuit comprising:
   a. a voltage source for supplying energy to said igniter circuit;
   b. a negative resistance light emitting diode having a predetermined threshold voltage and selectable conductive and nonconductive states, said diode emitting light in said conductive state when the voltage applied across said diode exceeds said predetermined threshold voltage;
   c. capacitor means connected in parallel with said diode and coupled to said voltage source to receive a charging current therefrom when said diode is in said nonconductive state, said capacitor means switching said diode to said conductive state when said capacitor means is charged to at least said predetermined threshold voltage to thereby discharge said capacitor means through said diode;
   d. means for generating a voltage for electrically igniting said gaseous material in response to the discharge of said capacitor means through said diode; and
   e. means for transmitting the light emitted from said diode to an observation point externally of said circuit; whereby the presence of light emission from said diode and the absence of ignition of said gaseous material is indicative of a deficiency in the quantity of gaseous material, while the absence of light emission and the absence of ignition of gaseous material is indicative of a deficiency in the operation of said ignition circuit.

2. An igniter circuit as set forth in claim 1, wherein said means for generating a voltage for igniting said gaseous material comprises a voltage boosting transformer having a primary winding connected in series with said diode and a secondary winding connected with ignition electrode means.

3. An igniter circuit as set forth in claim 1, wherein said voltge source is a battery.

4. An igniter circuit as set forth in claim 1, wherein said voltage source is a blocking oscillator circuit.

5. An igniter circuit as set forth in claim 1, further including a housing surrounding said circuit and said means for transmitting comprises a window in said housing in optical alignment with said diode.

* * * * *